United States Patent [19]
Postupack

[11] 4,383,016
[45] May 10, 1983

[54] METHOD FOR REPAIRING GLASS PHOTOMASKS

[75] Inventor: Dennis S. Postupack, Natrona Heights, Pa.

[73] Assignee: PPG Industries, Inc., Pittsburgh, Pa.

[21] Appl. No.: 305,430

[22] Filed: Sep. 25, 1981

[51] Int. Cl.$^3$ .............. G03F 5/00; C03C 15/00; C03C 17/00; G02B 5/22
[52] U.S. Cl. ............................ 430/5; 430/16; 65/30.1; 65/30.13; 65/60.4; 427/14.1; 427/25; 427/140; 427/443.2; 350/314; 350/319
[58] Field of Search ............ 430/5, 16; 65/30.1, 65/30.13, 60.4; 427/14.1, 25, 140, 443.2; 350/319, 314; 250/515.1

[56] References Cited

U.S. PATENT DOCUMENTS

| | | | |
|---|---|---|---|
| 2,732,298 | 1/1956 | Stookey | 95/5.5 |
| 2,911,749 | 11/1959 | Stookey | 41/26 |
| 2,927,042 | 3/1960 | Hall et al. | 117/38 |
| 3,561,963 | 2/1971 | Kiba | 96/36.3 |
| 3,573,948 | 4/1971 | Tarnopol | 117/5.5 |
| 3,620,795 | 11/1971 | Kiba | 117/5.5 |
| 3,669,770 | 6/1972 | Feldstein | 430/5 |
| 3,672,939 | 6/1972 | Miller | 117/54 |
| 3,723,158 | 3/1973 | Miller | 117/47 A |
| 3,732,792 | 5/1973 | Tarnopol et al. | 95/1 R |
| 4,155,735 | 5/1979 | Ernsberger | 65/30 E |

OTHER PUBLICATIONS

"One-Step Repair . . . Photodeposition", Ehrlich et al., *IEEE Electron Device Letters* vol. EDL-1, No. 6, 6/80, pp. 101–103.

*Primary Examiner*—Richard L. Schilling
*Attorney, Agent, or Firm*—Donna L. Seidel

[57] ABSTRACT

A method for repairing defects in the form of discontinuities in a photomask pattern in or on a glass substrate by means of electroless deposition of a nickel-containing coating on the surface of a glass substrate is disclosed.

9 Claims, No Drawings

METHOD FOR REPAIRING GLASS PHOTOMASKS

FIELD OF THE INVENTION

The present invention is related generally to the art of producing glass photomasks, and more particularly to the art of repairing defects in the photomask pattern.

BACKGROUND OF THE INVENTION

Photomasks are used in photolithographic processes for printing microelectronic circuits and other precision photofabricated parts. In a typical photolithographic process, a substrate is covered with a layer of photoresist material in a desired pattern which is photographically developed by superimposing a photomask over the photoresist material. The photomask has a pattern of opaque and transparent areas with respect to actinic radiation which is passed through the photomask to develop the pattern in the photoresist material. Typically, the actinic radiation is ultraviolet light. The pattern is developed in the photoresist material as a relief image by means of differing solubilities of the exposed and unexposed portions of the photoresist material. Since the preparation of a photomask involves the investment of a substantial amount of time, labor and materials, it is desirable that a photomask be sufficiently durable for repeated use in the manufacture of photofabricated articles. It is also desirable to maximize the resolution of the pattern carried by a photomask in order to improve the precision of the image it transfers to the photofabricated articles.

Some photomasks consist of sheets of glass bearing patterned coatings of photographic emulsion, iron oxide or chromium. Iron oxide and chromium are considerably more durable than photographic emulsions; however, all coating patterned photomasks are subject to scratching and other mechanical damage which shortens their useful life. Photomasks of improved durability comprising a stained pattern within a glass substrate are disclosed in U.S. Pat. No. 3,573,948 to Tarnopol and U.S. Pat. No. 3,732,792 to Tarnopol et al. Although these stained glass photomasks have improved durability, the step of etching a pattern through a stained layer of the glass in the former, or the step of etching through a tin oxide coating in the latter, results in insufficient resolution for some applications.

U.S. Pat. No. 3,561,963 to Kiba discloses a stained glass photomask wherein the desired pattern is etched into a copper film on a glass substrate and copper ions are subsequently migrated into the glass by heating. Although the stained photomask pattern is more durable than a coating, resolution is compromised in this process as a result of the thermal migration step which results in lateral spreading of the stained areas into the adjacent unstained areas.

U.S. Pat. No. 2,927,042 to Hall et al and U.S. Pat. No. 3,620,795 to Kiba disclose methods to minimize the lateral diffusion of staining in the aforementioned processes. The Hall patent describes depositing a film of stain-producing metal onto glass and removing portions of the film by photoetching. An electrical field is then passed through the glass so that the patterned film migrates into the glass substrate. The Kiba patent discloses etching a pattern into a metal film and migrating stain producing ions through apertures in the metal film by heating in an electrical field. Both methods suffer a loss of resolution as a result of the etching step.

U.S. Pat. Nos. 2,732,298 and 2,911,749 to Stookey both disclose the production of a stained image within a glass plate by heating a developed silver-containing photographic emulsion on the glass. However, the use of relatively high temperatures of 400° to 650° C. results in a loss of resolution of the stained pattern.

U.S. Pat. No. 4,155,735 to Ernsberger discloses an improved method for making stained glass photomasks. The method comprises developing a patterned photoresist layer on a glass substrate and then applying an electric field to enhance the migration of staining ions through apertures in the photoresist pattern into the surface of the glass substrate.

In all of the above-described methods for producing patterns in or on photomask substrates, defects can occur in the form of discontinuities in the photomask pattern as a result of dirt on the substrate, or impurities in the photoresist or in the staining material. Since the production of a photomask requires considerable investment of time, labor and materials, it is desirable to repair such defects rather than to reject the photomask plate. The present invention provides a method for repairing such defects in photomask patterns, whether these patterns are in the form of coatings on glass substrates or stained patterns within a glass substrate.

SUMMARY OF THE INVENTION

The present invention particularly provides a method for eliminating pin hole and line defects within the line and pad structure of the photomask pattern in a glass photomask assembly. The defect area is preferably repaired by depositing a metal coating over the defect. The metal deposit may be formed by placing a drop of an electroless metal coating solution followed by a drop of reducing solution on the defect area. This metal deposition process may be repeated until a density sufficient to block actinic radiation is obtained. In an alternative process, the electroless metal coating solution and reducing solution may be used to deposit a metal coating having a surface resistivity of about 100 ohms per square. This area may then serve as a plating cathode for the electroplating of metal to an effective radiation masking density. After the metal coating is applied over the defect area, the shape of the deposit may be precisely trimmed to the original pattern. Heat treatment of the coating may be performed to increase its durability.

In accordance with the present invention, the defect area is thoroughly cleaned, if necessary, to remove any dirt or oily residue from the substrate surface. In a typical case wherein the substrate is glass, the surface is made receptive to the electroless deposition of a metal film by sensitizing with tin chloride solution followed by activation with a palladium chloride solution. The receptive glass surface is then contacted with a drop of an electroless nickel plating solution and a drop of sodium borohydride reducing solution. After reaction, the area is rinsed and blown dry. This electroless deposition process is preferably repeated until a sufficient density is obtained to mask the actinic radiation. A density of about 2.0 is desirable for masking ultraviolet radiation. The repaired photomask will function in the same manner as a defect-free pattern. In an alternative embodiment, a drop of an electroless nickel plating solution is followed by a drop of a sodium borohydride reducing solution, and the reaction sequence repeated until a surface resistivity of about 100 ohms per square is obtained. The coated area is sufficiently conductive to serve as a plating cathode. A mobile electroplating cell may be placed over this cathode area and connected to a DC power supply. The defect area is subjected to electroplating until a sufficient masking density is obtained. The electroplating method requires less time than a strictly electroless plating technique. After a metal coating of a sufficient masking density is obtained by either method, the repaired area may be trimmed to match the original pattern. Trimming of excess metal deposit may be achieved by scraping with a metal razor knife or by dissolving the excess coating by utilizing dilute hydrochloric acid. To avoid the need for trimming, the defect area to be repaired may be defined by placing strips of tape along the pattern line. After deposition of the metal, a post-deposition heat treatment cycle may be employed to enhance the durability of the coating. For example, the coating may be heated for about 10 to 60 minutes at a temperature of about 250° to 350° C.

DETAILED DESCRIPTION OF THE PREFERRED EMBODIMENTS

While the present invention may be used to repair defects in photomask patterns which comprise either coatings on a variety of substrates or stained patterns within a glass substrate, the photomasks employed in accordance with the present invention are preferably prepared according to the techniques disclosed in U.S. Pat. No. 4,144,066, U.S. Pat. No. 4,155,735 and U.S. Pat. No. 4,309,495, the disclosures of which are incorporated herein by reference.

A high resolution stained glass photomask is made in accordance with these techniques, preferably by developing a silver-containing photographic emulsion on a glass substrate and migrating silver from the developed photographic emulsion into the glass. Silver ions migrate into the glass, displacing mobile cations, particularly alkali metal ions which migrate deeper into the glass substrate. The migrated silver ions are then reduced to the elemental state and agglomerated into submicroscopic crystals within the glass which produce a stained pattern. Both the reduction and agglomeration of silver ions are accomplished by means of heating in the presence of a reducing agent. The reducing agent may be tin ions which are normally present near the surface of float glass, in which case the reducing and agglomerating steps may be carried out in ambient air, or the reducing agent may be a reducing atmosphere such as forming gas maintained in a heating chamber. If a reducing gas atmosphere is employed, the stained pattern may be produced at a lower temperature, which results in less fictive shrinkage of the bulk glass and the photomask image. The glass substrates, within which the photomask patterns to be repaired in accordance with the present invention are prepared, may be of any typical glass composition which contains a sufficient quantity of mobile cations for displacement by the silver ions which are electromigrated into the glass to produce the stained photomask pattern. Most glass compositions contain sufficient alkali metal ions, such as sodium, potassium and lithium, for use in accordance with the present invention.

Photographic emulsions useful in producing stained photomask patterns which may be repaired in accordance with the present invention are those capable of being developed to produce a residual layer of emulsion and silver or silver halide which has sufficient electrical conductivity to permit electromigration of silver ions from the emulsion into the glass substrate. The emulsion should also have high resolution capability in order to produce a high resolution photomask pattern. Standard photographic techniques are employed to expose and develop the photographic emulsion. A glass substrate bearing a film of photographic emulsion is exposed to actinic radiation through a master pattern in order to form a latent image, which is subsequently developed in the photographic emulsion by exposure to appropriate developing solutions, whereby the silver halide in the exposed areas is converted to colloidal silver. Either a positive image or a negative image may be developed on the substrate depending upon the type of photographic emulsion employed and the developing process. Details of the developing techniques for both types of images are described in detail in the cited references.

In preferred embodiments of the present invention, an electrical field is employed to migrate silver ions from the developed photographic emulsion into the subjacent glass surface. Preferred voltages for the electromigration step are high enough to migrate the necessary quantity of silver ions within a reasonable period of time, but low enough to avoid arcing around the edges of the glass substrate between the anode and cathode layers, typically about 50 to 1000 volts. At ambient temperatures, the rate of ion migration may be impractically slow at these voltages. Therefore, moderately elevated temperatures, preferably above 100° C., are preferred in order to obtain adequate migration of silver ions within a reasonable time. Preferred temperatures include a range of about 100° to 350° C., preferably about 200° to 250° C., while preferred voltages are from about 200 to 700 volts.

Once a sufficient quantity of ionic silver has been electromigrated into the glass substrate to the desired depth, the stain pattern is developed by reduction of the silver ions to the elemental state, and agglomeration into submicroscopic crystals by application of heat in the presence of a reducing agent. The reducing agent may be metallic ions such as the tin ions inherently present in the surface layer of float glass or other ions such as copper ions purposefully present in the glass surface for use as a reducing agent. When metallic ions are used as the reducing agent, the reduction and agglomeration of silver to produce a stained pattern may be carried out in the ambient atmosphere. In the alternative, if insufficient such ions are present for use as a reducing agent, a reducing atmosphere such as hydrogen-containing gas, e.g. forming gas, in the heating chamber may be used to carry out the reduction and agglomeration of the silver ions. If a reducing atmosphere is used, the reduction and agglomeration of silver ions may be carried out in a shorter period of time. In either case, the period of time required for the reduction and agglomeration of the silver ions is a function of the temperature. Temperatures above about 400° C. are generally required for the reduction and agglomerations steps to proceed at a reasonable rate in an ambient atmosphere, while temperatures below about 525° C. are necessary to avoid deformation of the glass substrate. Optimum temperatures are in the range of about 475° to 525° C., at which temperatures reduction and agglomeration of the silver ions to produce a satisfactory stained photomask pattern can be accomplished in a period of about 15 minutes using metallic ions in the glass substrate as the reducing agent. When a reducing atmosphere is used as the reducing agent, practical rates of reduction and agglomeration of silver ions can be obtained at lower temperatures in the range of 300° to 400° C. These lower temperatures provide the advantage of minimizing lateral diffusion of the staining ions, and thereby maximizing resolution of the photomask pattern. A combination of a reducing gas atmosphere and an internal ionic reducing agent, such as tin, may be used to produce stained photomask patterns having enhanced optical and UV density.

After preparation of the photomask pattern is completed, the glass photomask plate is inspected for defects. Such defects may appear as discontinuities in the photomask pattern, such as pin holes or line defects. Relatively small defects, particularly in intricate patterns, may be sufficient to cause rejection of the photomask plate by commercial standards. Since a substantial amount of time, work and material has been expended in the production of a photomask plate, it is desirable to repair such defects. In accordance with the present invention, such defects are repaired by depositing a metal coating, preferably a nickel-containing coating, over the defect area to a sufficient thickness to mask the actinic radiation to which the photomask plate will be exposed. An electroless deposition technique such as the process described in U.S. Pat. No. 3,672,939 to Miller, the disclosure of which is incorporated herein by reference, is preferably employed. While various metallic coatings might be deposited, nickel-containing coatings, especially those deposited with boron-containing reducing agents, are preferred for their durability.

The glass surface of the defect area must have good wetting properties. Therefore, if necessary, the defect area should be cleaned with a detergent solution. The cleaned surface should then be rinsed and dried. The glass surface is preferably sensitized by applying a drop of tin chloride solution, which is allowed to stand for one or two minutes, then a drop of sodium borohydride solution. The sensitized surface is preferably rinsed and blown dry. The sensitized surface is then preferably activated by placing a drop of palladium chloride solution on the defect area, and adding a drop of electroless nickel plating solution and a drop of sodium borohydride reducing agent solution into the droplet of palladium chloride solution. The reaction should be allowed to continue until bubbling ceases and a black precipitate is formed within the solution. The area is preferably rinsed and blown dry. A drop of electroless nickel plating solution and a drop of borohydride reducing solution are applied to the activated surface over the defect area. The reaction is allowed to continue until bubbling ceases and a black precipitate is formed within the solution. The area is preferably rinsed and blown dry.

In accordance with one preferred embodiment of the present invention, the electroless plating steps are repeated until a deposit with a density of at least 2.0 with respect to ultraviolet radiation is obtained. In another preferred embodiment of the invention, the steps are repeated until a deposit is formed with a density of about 0.8 with respect to ultraviolet radiation. This deposit, while insufficient to repair the defect, provides a nickel coating sufficiently conductive to serve as an electrode for the electrolytic deposition of a nickel-containing film until a UV density of at least 2.0 is obtained. In either case, after a deposit with a UV density of at least 2.0 is obtained, the excess deposit may be trimmed away either with a metallic razor knife or by means of a wooden stylus dipped in dilute hydrochloric acid. After the excess deposit is trimmed away, the repaired defect area preferably is rinsed and blown dry. In another preferred embodiment of the present invention, the trimming techniques may be avoided by masking the defect area, e.g. by placing strips of tape along either side of the defect, and then conducting the plating steps to deposit a coating with an effective masking density.

The tin chloride sensitizing solution is preferably a solution of about one gram of stannous chloride in 100 milliliters of deionized water. The sodium borohydride solution is preferably a solution of 0.375 gram of sodium borohydride in 500 milliliters of deionized water, to which may be added sodium hydroxide to obtain a pH between about 11 and 11.3. The palladium chloride activating solution is used in concentrated form. It is preferred to use the palladium chloride activating solution, the electroless nickel plating solution and the sodium borohydride reducing solution all at temperatures in the range of 110° to 115° F. (about 43° to 46° C.). If a post-deposition heat treatment is performed, the coating is preferably heated for about 20 to 40 minutes at a temperature of about 300° C.

The present invention will be further understood from the descriptions of specific examples which follow.

EXAMPLE I

A stained glass photomask plate is inspected for defects. A defect area is repaired by sensitizing the glass surface above the defect with a solution of stannous chloride (1 gram/100 milliliters of water). The sensitized area is activated with a solution of palladium chloride (0.25 gram/100 milliliters of water). The surface, now receptive to electroless deposition of a nickel-containing coating, is contacted with a drop of nickel plating solution (5 grams of nickel acetate/liter of water) and a drop of reducing solution (0.375 gram of sodium borohydride/500 milliliters of water), both at a temperature of about 115° F. (about 46° C.). After the solutions have reacted, the surface is rinsed and blown dry. The plating step is repeated four times to yield a deposit having a luminous transmittance of about 2.0 percent and an ultraviolet light density of 2.3 measured with a Macbeth UV densitometer.

EXAMPLE II

A defect is repaired following the procedure of Example I except that the reducing solution contains 0.5 gram per liter of sodium borohydride. After eight applications, a coating with a luminous transmittance of 2.0 percent and a UV density of 2.21 is formed.

EXAMPLE III

A commercial glass photomask is inspected for defects. A defect area is cleaned with detergent solution to provide adequate wetting. A drop of stannous chloride solution (1 gram/100 milliliters deionized water) is placed over the defect area and allowed to stand for 1 to 2 minutes. A drop of sodium borohydride solution (0.375 gram/500 milliliters of water) is added before the surface is rinsed and blown dry. The sensitized area is contacted with a drop of palladium chloride solution (0.25 gram/liter deionized water) to which is added a drop of electroless nickel plating solution (prepared according to the NIKLAD 740 electroless nickel process with reagents available from ALLIED-KELITE of Des Plaines, Ill.) and a drop of sodium borohydride solution, both at 115° F. (about 46° C.). Reaction of the solutions is observable by the formation of bubbles and the precipitation of a black deposit. When the reaction ceases, the area is rinsed and blown dry. The area is contacted with a drop of nickel plating solution and sodium borohydride reducing solution as in the previous examples until a deposit having a UV density of 2.0 is formed.

EXAMPLE IV

A defect area in a glass photomask is treated as in Example III until a deposit with a UV density of about 0.8 is formed. The coated defect area is contacted with about 3 additional drops of nickel plating solution. A negative electrode (metal probe-cathode) is placed onto the nickel coating while a positive electrode (graphite rod-anode) is intermittently placed in contact with solution. The electroplating process is continued until a coating with a UV density of at least 2.0 is obtained. The repaired defect area is finally rinsed and blown dry.

The examples above are offered to illustrate the concept of the present invention. Various modifications such as the use of other well known electroless plating solutions, reducing agents and so on, are included within the scope of the invention which is defined by the following claims.

I claim:

1. In a method of making a patterned photomask plate utilizing a glass substrate for use in a photofabrication process, wherein defects appear as discontinuities in the photomask pattern, the improvement which comprises contacting said defect area with a solution of a nickel compound comprising reducible nickel ions and a solution of a reducing agent capable of reducing said nickel ions in order to deposit a nickel-containing coating having a sufficient density to mask actinic radiation employed in said photofabrication process.

2. The method according to claim 1, wherein the electroless deposition of nickel is continued until the nickel-containing coating has a density of at least 2.0 with respect to ultraviolet light.

3. The method according to claim 1, wherein the electroless deposition of nickel is continued until a deposit is formed having a surface resistivity of about 100 ohms per square or less, and then deposition of nickel is continued by electroplating until a nickel-containing coating is obtained which has a density of at least about 2.0 with respect to ultraviolet light.

4. The method according to claim 1, wherein the electroless deposition of a nickel-containing coating is accomplished by reduction of a nickel ion-containing compound with a sodium borohydride reducing agent.

5. The method according to claim 4, wherein the glass surface is cleaned, sensitized with stannous chloride and activated with palladium chloride prior to contacting said surface with said nickel compound and reducing agent.

6. The method according to claim 1, wherein the photomask pattern is prepared by providing a glass substrate with a layer of photographic emulsion containing silver halide on a first surface of the glass substrate; placing a master mask over the photographic emulsion layer and exposing the photographic emulsion to actinic radiation through the master mask; contacting the exposed photographic emulsion with photographic developing solutions, thereby producing on the first surface of the flat glass substrate a pattern of electroconductive silver-containing emulsion areas and silver-free areas; applying a first electrode layer onto the developed photographic emulsion on the first side of the glass substrate and applying a second electrode layer onto the glass surface on the opposite side of the glass substrate from said first surface; applying a direct current electrical field between the electrode layers so that electric charge passes through the silver-containing emulsion areas and the thickness of the glass substrate thereby inducing electromigration of silver ions from the silver-containing emulsion areas into portions of the glass underlying the silver-containing emulsion areas, while the temperature is maintained between about 100° and 350° C.; maintaining the glass at an elevated temperature in the presence of a reducing agent for a sufficient time to reduce and agglomerate the migrated silver ions within the glass, thereby producing a stained pattern within the surface of the glass.

7. The method according to claim 6, wherein the migrated silver ions are reduced by means of ionic metal reducing agents containing within the glass substrate.

8. The method according to claim 6, wherein the reduction of silver ions is accomplished by means of a reducing atmosphere.

9. The method according to claim 1, wherein said nickel-containing coating is heated for a period of about 10 minutes to 60 minutes at a temperature of about 250° to 350° C. to increase the durability of the coating.

* * * * *

UNITED STATES PATENT AND TRADEMARK OFFICE
CERTIFICATE OF CORRECTION

PATENT NO. : 4,383,016

DATED : May 10, 1983

INVENTOR(S) : Dennis S. Postupack

It is certified that error appears in the above-identified patent and that said Letters Patent is hereby corrected as shown below:

Column 8, Claim 7, line 40, "containing" should be ---contained---.

Signed and Sealed this

Nineteenth Day of July 1983

[SEAL]

*Attest:*

GERALD J. MOSSINGHOFF

*Attesting Officer*     *Commissioner of Patents and Trademarks*